(12) United States Patent
Hyodo et al.

(10) Patent No.: US 7,585,789 B2
(45) Date of Patent: Sep. 8, 2009

(54) METHOD FOR FORMING POROUS INSULATION FILM

(75) Inventors: Yasuyoshi Hyodo, Tama (JP); Kazuo Kohmura, Sodegaura (JP); Nobutoshi Fujii, Chigasaki (JP); Nobutaka Kunimi, Osaka (JP); Keizo Kinoshita, Tokyo (JP)

(73) Assignees: ASM Japan K.K., Tokyo (JP); Ulvac, Inc., Kanagawa (JP); NEC Corporation, Tokyo (JP)

( * ) Notice: Subject to any disclaimer, the term of this patent is extended or adjusted under 35 U.S.C. 154(b) by 155 days.

(21) Appl. No.: 11/604,598

(22) Filed: Nov. 27, 2006

(65) Prior Publication Data

US 2007/0158013 A1 Jul. 12, 2007

(30) Foreign Application Priority Data

Nov. 28, 2005 (JP) ............................. 2005-342154

(51) Int. Cl.
*H01L 21/31* (2006.01)
*H01L 21/469* (2006.01)

(52) U.S. Cl. ............... 438/789; 438/784; 257/E21.478; 257/E21.493; 427/255.25; 427/255.37

(58) Field of Classification Search ................ 438/783, 438/784, 789; 257/E21.478, E21.493, E21.494, 257/E21.546, E21.576; 427/255.25, 255.37
See application file for complete search history.

(56) References Cited

U.S. PATENT DOCUMENTS

| | | | |
|---|---|---|---|
| 6,432,846 B1 | 8/2002 | Matsuki | |
| 6,602,800 B2 | 8/2003 | Matsuki | |
| 2003/0033980 A1* | 2/2003 | Campbell et al. | ............ 118/715 |
| 2006/0021701 A1 | 2/2006 | Tobe et al. | |
| 2006/0078676 A1* | 4/2006 | Lukas et al. | .............. 427/248.1 |
| 2006/0151884 A1* | 7/2006 | Hara et al. | .................... 257/759 |
| 2007/0173071 A1* | 7/2007 | Afzali-Ardakani et al. | .. 438/781 |
| 2007/0189961 A1* | 8/2007 | Iacopi et al. | ................. 423/702 |

FOREIGN PATENT DOCUMENTS

| | | | |
|---|---|---|---|
| EP | 1566835 | * | 8/2005 |
| JP | 2004049422 | * | 6/2004 |

OTHER PUBLICATIONS

Nobuhiro Hata, et al., "Control of Pore Structures in Periodic Porous Silica Low-*k* Films," Japanese Journal of Applied Physics, vol. 43, No. 4A, 2004, pp. 1323-1326.
Nobutoshi Fuji, et al., "Comparative Studies of Ultra Low-*k* Porous Silica Films with 2-D Hexagonal and Disordered Pore Structures," Mat. Res. Soc. Symp. Proc. vol. 812 F4.10.1-F4.10.6, 2004.
U.S. Appl. No. 11/559,797, filed Nov. 14, 2006, Hyoda et al.
U.S. Appl. No. 11/175,511, filed Jul. 6, 2005, Fukazawa et al.

* cited by examiner

*Primary Examiner*—Caridad M Everhart
(74) *Attorney, Agent, or Firm*—Knobbe Martens Olson & Bear LLP

(57) ABSTRACT

A method of forming a porous film on a semiconductor substrate includes: supplying a silicon compound containing at least one Si—O bond in its molecule in a gaseous phase into a reaction chamber; forming a siloxane oligomer through plasma reaction of the silicon compound; and supplying an organic amine in a gaseous phase into the reaction chamber and reacting the organic amine with the siloxane oligomer, thereby forming a porous film on the semiconductor substrate.

17 Claims, 1 Drawing Sheet

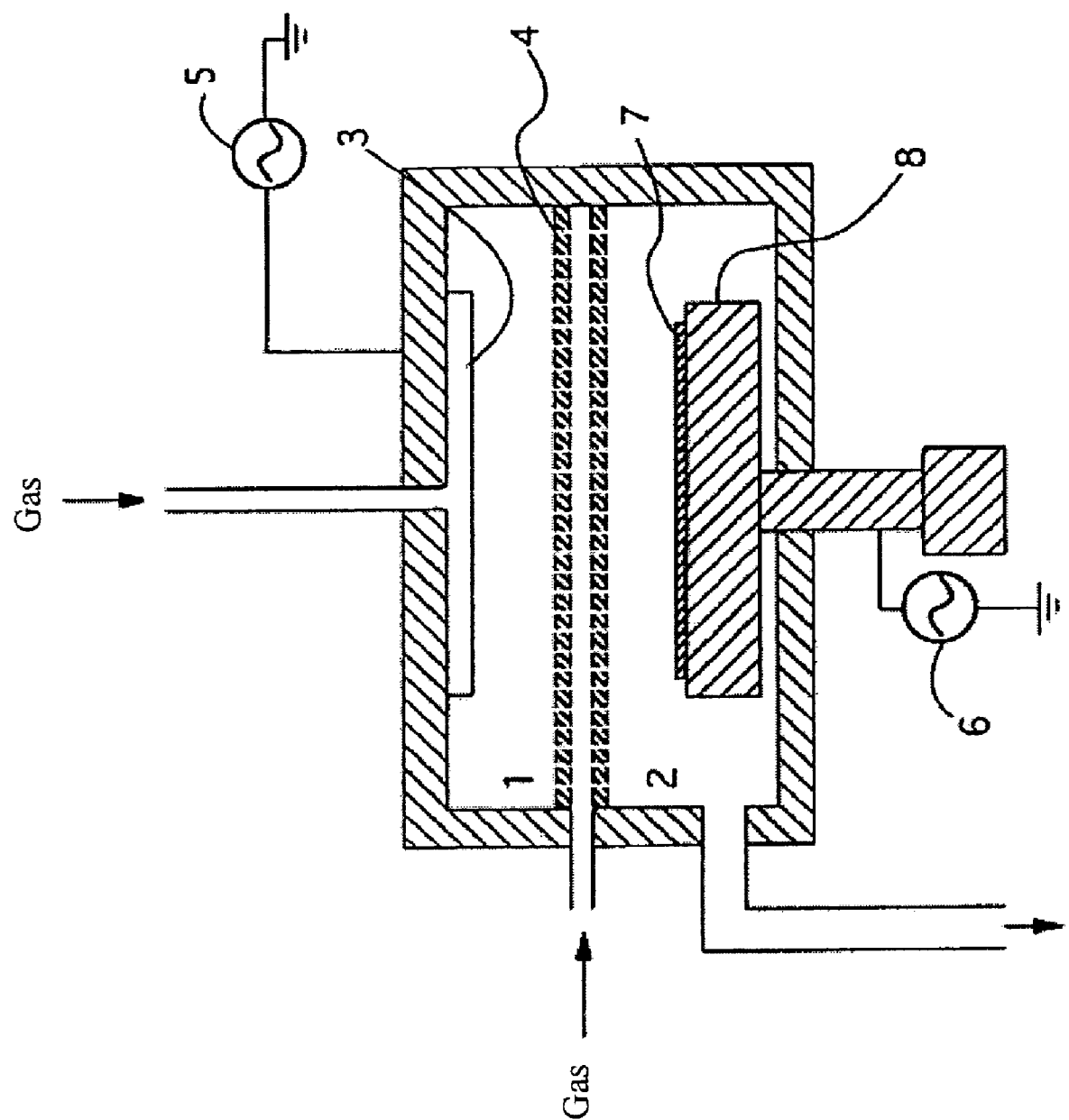

METHOD FOR FORMING POROUS INSULATION FILM

BACKGROUND OF THE INVENTION

1. Field of the Invention

The present invention relates to thin film formation technology for integrated semiconductor circuit, and particularly to a method of forming a porous film having low dielectric constant for use as inter-layer insulation film for multi-layer wiring.

2. Description of the Related Art

Wiring widths and intervals have been constantly decreasing in recent years to respond to the needs for more highly integrated, faster semiconductor devices. As this trend accelerates, however, one problem has surfaced that pertains to signal delay caused by wiring resistance (R) and inter-wire capacity (C) in a multi-layer wiring structure constituting a semiconductor device (this delay is called "RC delay"). To reduce RC delay, the industry first adopted copper having lower resistance R in place of traditional aluminum. In 90-nm node applications, the industry also replaced silicon oxide film ($SiO_2$ film) having a dielectric constant k of 4 used traditionally as inter-layer insulation film, with another class of film exhibiting low dielectric constant (low-k film), called SiOC film, produced by introducing methyl groups into silicon oxide film. Examples of SiOC film include siloxane polymer film (SiOC film) whose specific dielectric constant is less than 3.0, formed by the plasma CVD method using $(CH_3)_2Si(OCH_3)_2$ and other material gases as disclosed in U.S. Pat. No. 6,432,846.

Next-generation 65-nm and 45-nm nodes are demanding inter-layer insulation film exhibiting even lower levels of specific dielectric constant, and ITRS (International Technology Roadmap for Semiconductors) 2003 reported specific dielectric constant 2.4 for 65-nm nodes and 2.1 or less for 45-nm nodes as ideal levels of specific dielectric constant. To achieve these levels of specific dielectric constant, an attempt has been made to introduce air, which has a specific dielectric constant of 1, into film (i.e., to make pores in film). For example, porous silica film developed under the Semiconductor MIRAI Project has a specific dielectric constant of 2.0. Through X-ray measurement, this film has been shown to have many pores with a diameter of approx. 2 nm (e.g., Hata et al., J. J. Appl. Phys 43(2004), 1323, Fujii et al., Mat. Res. Soc. Symp. Proc. Vol. 812, F4.10.1).

This porous silica film is formed by means of coating a semiconductor substrate with polysiloxane solution containing pore-forming casting molecules, and then heat-treating the coated substrate. In the solution, multiple pore-forming casting molecules come together to form micelles. When heat is applied, polysiloxane constitutes a network and at the same time micelles break down and are removed from the film due to the effect of heat. As a result, polysiloxane film containing pores with a diameter of several nm is formed. The coating method allows for easy material design, and the specific dielectric constant of film as well as pore diameter can be adjusted by changing the size and quantity of pore-forming casting molecules contained in the solution.

SUMMARY OF THE INVENTION

In a gaseous-phase method like plasma CVD, material gas is supplied in gaseous form and therefore molecules with a molecular weight exceeding 500 cannot be used as material. To create pores with a diameter of several nm, the molecular weight of micelles becomes nearly 10,000 (Hata et al., J. J. Appl. Phys 43(2004), 1323). Such heavy molecules cannot be supplied in gaseous form. This means that conventionally, porous silica film having pores of several nm can only be formed using a coating method.

In a semiconductor device, inter-layer insulation film contacts different types of film such as barrier film and etch stopper film. For this reason, low-k inter-layer insulation film must have good adhesion property with respect to these other films, in addition to exhibiting low dielectric constant. Semiconductor devices are manufactured in a number of processes, and the process of forming inter-layer insulation film is one of them. Therefore, changing the process conditions in the preceding and/or subsequent processes will change the film quality required of inter-layer insulation film. With any coating method, the composition of film material solution must be changed. However, it is difficult to make the necessary changes quickly.

On the other hand, optimization of film quality is easy if inter-layer insulation film is formed using a gaseous-phase method, one representative example of which is plasma CVD. Since all it takes is to change the setting conditions (flow rate, pressure, etc.) of the film forming apparatus, optimization can be done quickly. Also, changing the film forming conditions in the initial or final stage of the film formation process is also easy, and such in-process changes can be made to improve the adhesion property of film. For these reasons, it is desirable that low-k inter-layer insulation film be formed using a gaseous-phase method.

In view of the above, in an embodiment, an object of the present invention is mainly to provide a method of forming with a gaseous-phase method low-k porous film comprising at least one Si—O bond.

To solve at least one of the aforementioned problems, in an embodiment, the present invention provides a method of forming a porous film of low dielectric constant on a semiconductor substrate using a plasma CVD apparatus, comprising the steps of: (i) vaporizing a silicon compound containing at least one Si—O bond in its molecule and supplying the vapor into a reaction chamber; (ii) forming a siloxane oligomer through plasma reaction; and (iii) supplying an organic amine into the reaction chamber and reacting the organic amine with the siloxane oligomer, thereby forming a porous film on the semiconductor substrate. In the above, "a silicon compound" and "an organic amine" are collective terms and can be comprised of one or more silicon compounds and one or more organic amine, respectively.

In an embodiment, preferably, the organic amine may be an amine expressed by the general formula (1) below.

$$[R_{13}R_{14}R_{15}R_{16}N]^+ \cdot OH^- \qquad (1)$$

wherein $R_{13}$, $R_{14}$, $R_{15}$ and $R_{16}$ are independently $C_nH_{2n+1}$ (n is an integer of 1 to 5).

In an embodiment, this method may further comprise heating the semiconductor substrate after the film has been formed.

In another embodiment, the present invention provides a method of forming porous film of low dielectric constant on a semiconductor substrate using a plasma CVD apparatus comprising the steps of: (i) vaporizing an organic monomer and supplying the vapor into a reaction chamber and forming fine organic particles through plasma reaction; (ii) vaporizing a silicon compound containing at least one Si—O bond in its molecule; (iii) supplying the vapor into the reaction chamber and forming a siloxane oligomer through plasma reaction; (iv) supplying an organic amine into the reaction chamber and reacting the organic amine with the siloxane oligomer; and (v) removing the fine organic particles from the thin film formed on the semiconductor substrate.

In the above, "an organic monomer", "an organic compound" and "a silicon compound" are collective terms and can be comprised of one or more organic monomers, one or more compounds and one or more silicon compounds, respectively.

According to an embodiment of the present invention, a porous film of low dielectric constant structured mainly by Si—O bonds can be formed using a gaseous-phase method.

In an embodiment, the present invention can also reduce the time needed to make fine changes to film quality, which meets the need for new generations of products requiring multiple wiring layers and different technical standards during their manufacturing processing on semiconductor apparatuses.

In an embodiment, the present invention can further achieve a way to easily form a porous film of low dielectric constant without requiring any additional apparatus or increasing the manufacturing cost.

For purposes of summarizing the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawing of a preferred embodiment which is intended to illustrate and not to limit the invention. The drawing is oversimplified for illustrative purposes and is not to scale.

The FIGURE is a schematic drawing of a plasma CVD apparatus having two separate chambers, being used to form porous film according to an embodiment of the present invention.

DETAILED DESCRIPTION OF THE PREFERRED EMBODIMENT

The present invention will be explained with reference to preferred embodiments. However, the preferred embodiments are not intended to limit the present invention.

As explained above, in an embodiment, the method comprises the steps of: (i) supplying a silicon compound containing at least one Si—O bond in its molecule in a gaseous phase into a reaction chamber; (ii) forming a siloxane oligomer through plasma reaction of the silicon compound; and (iii) supplying an organic amine in a gaseous phase into the reaction chamber and reacting the organic amine with the siloxane oligomer, thereby forming a porous film on the semiconductor substrate. The reaction of the organic amine and the silicon compound starts in a gaseous phase and takes place substantially on the substrate, thereby forming a zeolite-type microporous structure. After the completion of the reaction, nitrogen atom may not remain in the porous film. The above explanations are not intended to limit the above embodiment.

The above embodiment further includes, but is not limited to, the following embodiments:

In an embodiment, the silicon compound may have three or more Si—O bonds. In another embodiment, the silicon compound may be a cyclic siloxane compound expressed by $[Si(RR')—O]_\alpha$ wherein R and R' are hydrocarbon groups, and $\alpha$ is an integer of 3 to 5. In still another embodiment, the silicon compound may be expressed by $SiR_5(OR_6)(OR_7)(OR_8)$ wherein $R_5$ is a hydrocarbon group of $C_{1-6}$, and $R_6$, $R_7$ and $R_8$ are independently $C_nH_{2n+1}$ wherein n is an integer of 1 to 3. In yet another embodiment, the silicon compound may be expressed by $Si(OR_9)(OR_{10})(OR_{11})(OR_{12})$ wherein $R_9$, $R_{10}$, $R_{11}$ and $R_{12}$ are independently $C_nH_{2n+1}$ wherein n is an integer of 1 to 5. In a particular embodiment, the silicon compound may be tetraethoxysilane or tetramethoxysilane. In the above, the silicon compound may need to be vaporized upstream of the reaction chamber.

In an embodiment, the step of forming the siloxane oligomer may further comprise supplying into the reaction chamber $H_2O$ and/or a compound having an OH bond in a gaseous phase as an additive gas. The flow of the additive gas may be less than (e.g., 10-45% of) that of the silicon compound. In the above, the $H_2O$ and/or the compound having an OH bond may need to be vaporized upstream of the reaction chamber.

In an embodiment, the organic amine may be expressed by the general formula $[R_{13}R_{14}R_{15}R_{16}N]^+.OH^-$, where $R_{13}$, $R_{14}$, $R_{15}$ and $R_{16}$ are $C_nH_{2n+1}$, n is an interger of 1 or greater (e.g., an integer of 1-5). The organic amine may be used in aqueous form, and a ratio of the liquid flow of the silicon compound to that of the organic amine solution upstream of the reaction chamber may be 1/10 to 10/1 (e.g., 3/5 to 5/3). The organic amine solution need to be vaporized upstream of the reaction chamber.

In an embodiment, the method may further comprise heating (e.g., annealing in an $N_2$ atmosphere) the semiconductor substrate after the film is formed thereon.

In an embodiment, the reaction chamber may be divided into upper and lower sections, and the silicon compound may be supplied into the upper section whereas the organic amine may be supplied into the lower section. In the above, the silicon compound may be supplied into the upper section through an upper shower plate to which RF power is applied, whereas the organic amine may be supplied into the lower section through an intermediate shower plate which may be electrically grounded in an embodiment. In another embodiment, the reaction chamber may be composed of a single chamber where the formation of porous film is performed.

In the above embodiments, the porous film may have a dielectric constant of 2.7 or less (including 2.65, 2.6, 2.5, 2.4, 2.3, 2.2, and any number between any of the foregoing). This porous film may have a thickness of 100 nm to 1,000 nm.

In an embodiment, the method may further comprise: (a) supplying an organic monomer in a gaseous phase into the reaction chamber and forming fine organic particles through plasma reaction of the organic monomer, thereby forming the porous film including the fine organic particles; and (b) removing the fine organic particles from the porous film formed on the substrate.

In the above, the removing of the fine organic particles may be performed by heating (e.g., annealing in an $N_2$ atmosphere).

In an embodiment, the reaction chamber may be divided into upper and lower sections, and the organic monomer may be supplied into the upper section whereas the silicon compound and the organic amine may be supplied into the lower section. In an embodiment, the organic monomer may be supplied into the upper section through an upper shower plate to which RF power may be applied, whereas the silicon compound and the organic amine may be supplied into the lower section through an intermediate shower plate while RF power is applied to a susceptor on which the substrate is placed. In an embodiment, the intermediate plate is electrically grounded. In another embodiment, the reaction chamber may be composed of a single chamber where the formation of porous film is performed.

In an embodiment, the porous film obtained upon removing the fine organic particles may have a dielectric constant of 2.5 or less (including 2.45, 2.4, 2.3, 2.2, 2.1, and any number between any of the foregoing). This porous film may have a thickness of 100 nm to 1,000 nm.

As the method using the organic monomer, the method disclosed in U.S. patent application Ser. No. 11/559,797, filed Nov. 14, 2006, owned by the same assignees as in the present application can be used, and the disclosure of which is incorporated herein by reference in its entirety.

In an embodiment, the present invention provides a method of forming a porous film on a semiconductor substrate, comprising the steps of: (i) vaporizing an organic monomer and supplying the vapor into the reaction chamber; (ii) forming fine organic particles through plasma reaction of the organic monomer; (iii) vaporizing a silicon compound having at least one Si—O bond and supplying the vapor into the reaction chamber; (iv) forming a siloxane oligomer through plasma reaction of the vaporized silicon compound in the reaction chamber; (v) supplying an organic amine into the reaction chamber and reacting the organic amine with the siloxane oligomer, thereby forming a thin film including the fine organic particles on the substrate; and (vi) removing the fine organic particles from the thin film to form a porous film on the semiconductor substrate.

Preferred embodiments of the present invention are explained in details below by referring to a drawing. The FIGURE is a schematic drawing of a two-chamber, separation-type gaseous-phase film formation apparatus used in the method of forming thin film conforming to an embodiment of the invention proposed by the present application for patent. This apparatus comprises two levels of processing chambers provided at top and bottom 1, 2, each having an exhaust means. An upper electrode 3 is installed on the ceiling of the upper processing chamber 1, and connected to an external gas supply apparatus (not illustrated). The bottom face of the upper electrode 3 has many pores, and gas is supplied into the upper processing chamber 1 through these pores. The upper electrode 3 also connects to an external high-frequency oscillator 5 to serve as a high-frequency electrode, as well.

Installed inside the lower processing chamber 2 is a susceptor 8 on which to place a semiconductor substrate 7 that becomes a processing target. The susceptor 8 has heating elements (not illustrated) embedded inside, and serves to heat the semiconductor substrate 7 to a specified temperature and maintains that temperature. The susceptor 8 connects to an external high-frequency oscillator 6 to serve as a high-frequency electrode, as well. The frequency ranges of these high-frequency oscillators 5, 6 may be selected depending on the plasma properties desired in the respective processing chambers and may be the same or different. In an embodiment, the frequency ranges are between 1 MHz and 100 MHz.

An intermediate shower plate 4 is installed between the upper processing chamber 1 and lower processing chamber 2. The intermediate shower plate 4 is connected to an external material gas supply apparatus (not illustrated), and has many pores through which to supply material gas into the lower processing chamber 2. It also has many pores through which to introduce fine particles comprising organic compound, as formed in the upper processing chamber 1, into the reaction space inside the lower processing chamber 2. The intermediate shower plate 4 is electrically connected to ground. In an embodiment, the intermediate shower plate 4 comprises upper and lower compartments isolated from each other with respect to gas and allows gas in the upper processing chamber 1 to pass therethrough via first pores without gas-communicating with the interior of the intermediate shower plate 4 while introducing gas into the lower processing chamber 2 via second pores without gas-communicating with the upper processing chamber 1. This type of intermediate shower plate is disclosed in U.S. Patent Publication No. 2006/0021701, the disclosure of which is incorporated herein by reference in its entirety.

An exhaust port (not illustrated) is provided in the upper processing chamber 1 or lower processing chamber 2, or both, to exhaust air from the processing chamber(s), and each port is connected to an external vacuum pump (not illustrated). Each processing chamber is maintained at a specified pressure by means of a throttle valve.

Next, preferred embodiments of the method of forming porous film are explained.

The preferred method conforming to an embodiment of the present invention includes a process of vaporizing a silicon compound having Si—O bond and supplying the vapor into the reaction chamber. After the processing chambers 1, 2 are evacuated, a silicon compound having Si—O bond that has been vaporized in an external evaporator (not illustrated) is supplied into the upper processing chamber 1 through the upper electrode 3.

The silicon compound having Si—O is a cyclic siloxane compound expressed by [Si(RR')—O]α. Here, R and R' may independently be hydrocarbon groups, respectively, and preferably any one of $CH_3$, $C_2H_3$, $C_2H_5$, $C_3H_7$ or $C_6H_5$. α is an interger of 3 to 5.

In one example, the silicon compound having Si—O bond may be a compound expressed by the general formula (A) below.

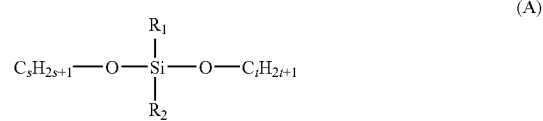

(A)

Here, $R_1$ and $R_2$ may independently be hydrocarbon groups, respectively, and preferably any one of $CH_3$, $C_2H_3$, $C_2H_5$, $C_3H_7$ or $C_6H_5$. s and t are arbitrary intergers of 1 or greater (e.g., 1-10 or 1-5).

In a different example, the silicon compound having Si—O bond may be a compound expressed by the general formula (B) below.

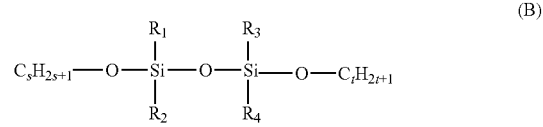

(B)

Here, $R_1$, $R_2$, $R_3$ and $R_4$ may independently be hydrocarbon groups, respectively, and preferably be any one of $CH_3$, $C_2H_3$, $C_2H_5$, $C_3H_7$ or $C_6H_5$. s and t are arbitrary integers of 1 or greater (e.g., 1-10 or 1-5).

In another different example, the silicon compound having Si—O bond may be a compound expressed by the general formula (C) below.

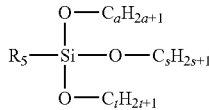

(C)

Here, $R_5$ may be a hydrocarbon group of $C_{1-6}$, and preferably be any one of $CH_3$, $C_2H_3$, $C_2H_5$, $C_3H_7$ or $C_6H_5$. a, s and t may independently be arbitrary integer of 1 or greater, but preferably between 1 and 3.

In yet another different example, the silicon compound having Si—O bond may be a compound expressed by the general formula (D) below.

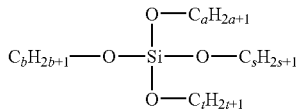

(D)

Here, a, b, s and t may independently be arbitrary integers of 1 or greater, but preferably between 1 and 5.

In addition to the above, the silicon compound having Si—O bond may be tetraethoxysilane (TEOS) or tetramethoxysilane (TMOS).

Inactive gas such as He or Ar is also supplied into the upper reaction chamber 1 as dilution gas. Such inactive gas may be supplied as carrier gas when the silicon compound is vaporized. He gas, Ar gas, etc., will be needed to generate plasma.

Also, oxidizing gas such as $O_2$, $N_2O$, $CO_2$, or CO may be supplied together with the aforementioned silicon compound. These oxidizing gases react with hydrocarbon contained in the silicon compound and have the effect of removing them from the silicon compound. As a result, Si—O bonds contained in the silicon compound polymerize with one another to make it easier for siloxane oligomer to form.

In addition, $H_2O$ or alcohol such as $CH_3OH$, $C_2H_5OH$ or $C_3H_7OH$ may be used as an additive. By supplying $H_2O$, Si—O bonds undergo hydrolysis and this also makes it easier for siloxane oligomer to form.

The preferred method conforming to an embodiment of the present invention includes a process of forming siloxane oligomer. Plasma generates when high-frequency power is applied to the upper electrode 3 from the upper high-frequency power supply 5. The frequency of high-frequency power may be in a range of 1 MHz to 100 MHz, or preferably 13.56 MHz, 27 MHz or 60 MHz. High-frequency power can also be applied intermittently, in which case the frequency may be in a range of 1 Hz to 100 kHz, or preferably in a range of 1 Hz to 1 kHz.

Plasma polymerization reaction forms siloxane oligomer having Si—O—Si bond in gaseous phase. This siloxane oligomer is introduced into the lower reaction chamber 2 through the pores provided in the intermediate shower plate 4.

The preferred method conforming to an embodiment of the present invention includes a process of supplying an organic amine into the reaction chamber and causing it to react with the siloxane oligomer. After the siloxane oligomer has been introduced into the lower reaction chamber 2 through the pores provided in the intermediate shower plate 4, an organic amine is supplied into the lower reaction chamber 2 through different pores in the intermediate shower plate 4. This organic amine may be one expressed by the chemical formula (1) below, for example.

$$[R_{13}R_{14}R_{15}R_{16}N]^+.OH^- \quad (1)$$

(In the formula, $R_{13}$, $R_{14}$, $R_{15}$ and $R_{16}$ are $C_nH_{2n+1}$ (here, n is an integer of 1 to 5).)

Reaction of siloxane oligomer and organic amine occurs in the lower reaction chamber 2, and film of porous siloxane oligomer is formed on the semiconductor substrate 7. Thereafter, the semiconductor substrate 7 is heated to cause the deposited film to migrate to a thermodynamically stable state, and consequently porous film mainly comprising Si—O bond is formed on the semiconductor substrate 7. This porous film has pores with a size of 5 nm or less, or preferably 2 nm or less. However, in an embodiment, the average size of pores may be 1 nm or more (the average size of pores in a film formed without using the organic amine may be about 0.5 nm) The size of pores can be measured using X-ray scattering (e.g., Hata et al., J. J. Appl. Phys 43(2004), 1323). The amount of pores in the film, as well as characteristics of the film, can be adjusted by controlling the process conditions, and therefore porous film offering desired specific dielectric constant and adhesion property can be formed in gaseous phase.

Next, another method of forming porous film, also conforming to an embodiment of the present invention, is explained. This other method conforming to the present invention includes a process of vaporizing an organic monomer and supplying the vapor into the reaction chamber, and a process of forming fine organic particles through plasma reaction.

As for organic compound, at least one type of organic compound can be selected and used from a group consisting of: methane, ethane, propane, butane and other aliphatic hydrocarbons; ethylene, propene, butene, butadiene, acethylene, propylene, butyne and other hydrocarbons having carbon-carbon multi-bond; benzene, toluene, xylene, styrene, acrylbenzene, divinylbenzene and other aromatic hydrocarbons; acrylate, methyl acrylate, ethyl acrylate, methyl methacrylate and ethyl methacrylate. The organic monomer is vaporized in an external evaporator (not illustrated), and then supplied into the upper reaction chamber 1 through the pores provided in the upper electrode 3.

Next, high-frequency power is applied to the upper electrode 3 from the high-frequency oscillator 5. The frequency of high-frequency power may be in a range of 1 MHz to 100 MHz, or preferably be 13.56 MHz, 27 MHz or 60 MHz. High-frequency power may also be applied intermittently, in which case the frequency may be in a range of 1 Hz to 100 kHz, or preferably in a range of 1 Hz to 1 kHz. By generating plasma in the upper processing chamber 1 and thereby activating the organic monomer, polymerization reaction occurs and fine organic particles are synthesized as a result. Here, helium, argon or other dilution gas is needed to generate plasma. Thus synthesized fine organic particles are introduced into the lower processing chamber 2 through the pores in the intermediate shower plate 4.

This other method conforming to an embodiment of the present invention includes a process of vaporizing a silicon compound having Si—O bond and supplying the vapor into the reaction chamber, and a process of forming siloxane oligomer through plasma reaction. In addition to a silicon compound, an oxidizing agent and/or additive may also be added. Here, the silicon compound having Si—O bond, oxidizing agent and additive are not explained, as they are the same as those explained in the aforementioned preferred example.

Thus vaporized silicon compound is supplied into the lower reaction chamber 2 through different pores in the intermediate shower plate 4.

High-frequency power with a frequency in a range of 1 MHz to 100 MHz, or preferably of 13.56 MHz, 27 MHz or 60 MHz, is applied to the susceptor 8 from the lower high-frequency power supply 6. High-frequency power may also be applied intermittently, in which case the frequency may be in a range of 1 Hz to 100 kHz, or preferably in a range of 1 Hz to 1 kHz. Plasma polymerization reaction occurs in the lower reaction chamber 2, and siloxane oligomer is formed as a result. Consequently, thin film comprising fine organic particles synthesized in the upper reaction chamber 1, and also siloxane oligomer formed in the lower reaction chamber 2, is deposited on the semiconductor substrate 7.

This other method conforming to an embodiment of the present invention includes a process of supplying an organic amine and causing it to react with the siloxane oligomer. This organic amine is the same as the one expressed by the general formula (1) above. The organic amine is supplied into the lower reaction chamber 2 through the pores provided in the intermediate shower plate 4. The organic amine may also be supplied into the lower reaction chamber 2 simultaneously with the aforementioned silicon compound having Si—O bond. When the siloxane oligomer deposited on the semiconductor substrate 7 reacts with the organic amine, the siloxane oligomer becomes porous. As a result, film comprising this porous siloxane oligomer and fine organic particles is deposited on the semiconductor substrate 7.

This other method conforming to an embodiment of the present invention includes a process of removing fine organic particles from the film deposited on the semiconductor substrate 7. The semiconductor substrate 7 is heated at 400° C. for one hour in a $N_2$ atmosphere to remove fine organic particles in the film.

Thus, porous film of low dielectric constant mainly comprising Si—O bond and having pores with a size of 5 nm or less, or preferably 2 nm or less, is obtained. However, in an embodiment, the average size of pores may be 1 nm or more (the average size of pores in a film formed without using the organic amine or the fine organic particles may be about 0.5 nm) As in the preferred example, the process conditions in gaseous phases can be controlled to adjust the amount of pores in the film, which allows for production of film having desired specific dielectric constant and film characteristics.

The conditions of formation and curing of a film disclosed in U.S. patent application Ser. No. 11/175,511 owned by the same assignee can be used in an embodiment, the disclosure of which is incorporated herein by reference in its entirety.

EXAMPLES

Using an CVD apparatus (Eagle®-6, manufactured by ASM Japan K.K.), porous film was formed on a semiconductor substrate using the methods shown below, and the specific dielectric constant of the obtained film was measured. The details of these examples are explained below. It should be noted, however, that the present invention is not at all limited to these examples. The figures such as the flow rates and the RF power indicated in the examples can be modified by ±50%.

Example 1

1 g/min of tetraethoxysilane (TEOS) and 0.4 g/min of water ($H_2O$) were supplied into the upper processing chamber 1, 100 W of RF with a frequency of 13.56 MHz was applied to the upper electrode 3, and then 1 g/min aqueous tetrapropyl ammonium solution (TPAOH) was supplied through the intermediate shower plate 4, to form thin film on a semiconductor substrate placed on the susceptor 8. The formed film was heated at 300° C. for 10 minutes (in a $N_2$ atmosphere). The specific dielectric constant k of the obtained film was 2.6.

Example 2

1 g/min of methyl methacrylate (MMA) was supplied into the upper processing chamber 1, 200 W of RF with a frequency of 13.56 MHz was applied to the upper electrode 3, 0.2 g/min of tetraethoxysilane and 1 g/min of aqueous tetrapropyl ammonium solution (TPAOH) were supplied through the intermediate shower plate 4, and then 50 W of RF with a frequency of 13.56 MHz was applied to the susceptor 8, to form thin film on a semiconductor substrate placed on the susceptor 8. The formed film was heated at 400° C. for 1 hour (in a $N_2$ atmosphere). The specific dielectric constant k of the obtained film was 2.4.

The present invention includes the above mentioned embodiments and other various embodiments including the following:

1) A method of forming porous film on a semiconductor substrate using a plasma CVD apparatus, comprising: a process of vaporizing a silicon compound having Si—O bond and supplying the vapor into the reaction chamber; a process of forming siloxane oligomer through plasma reaction; and a process of supplying an organic amine into the reaction chamber and causing it to react with the siloxane oligomer, thereby forming porous film on the semiconductor substrate.

2) A method according to Item 1, wherein the silicon compound having Si—O bond has three or more Si—O bonds.

3) A method according to Item 1, wherein the silicon compound having Si—O bond is a cyclic siloxane compound expressed by $[Si(RR')—O]_\alpha$ (where R and R' are hydrocarbon groups, while $\alpha$ is an integer of 3 to 5).

4) A method according to Item 1, wherein the silicon compound having Si—O bond is expressed by $SiR_5(OR_6)(OR_7)(OR_8)$ where $R_5$ is a hydrocarbon group of $C_{1-6}$, while $R_6$, $R_7$ and $R_8$ are $C_nH_{2n+1}$ (n is an integer of 1 to 3).

5) A method according to Item 1, wherein the silicon compound having Si—O bond is expressed by $Si(OR_9)(OR_{10})(OR_{11})(OR_{12})$ where $R_9$, $R_{10}$, $R_{11}$ and $R_{12}$ are $C_nH_{2n+1}$ (n is an integer of 1 to 5).

6) A method according to Item 1, wherein the silicon compound having Si—O bond is tetraethoxysilane or tetramethoxysilane.

7) A method according to Item 1, wherein the process of forming siloxane oligomer includes a process of adding $H_2O$ or a compound having OH bond as an additive.

8) A method according to Item 1, wherein the organic amine is expressed by the general formula $[R_{13}R_{14}R_{15}R_{16}N]^+.OH^-$, where $R_{13}$, $R_{14}$, $R_{15}$ and $R_{16}$ are $C_nH_{2n+1}$ (n is an integer of 1 or greater).

9) A method according to Item 1, further including a process of heating the semiconductor substrate after film has been formed.

10) A method of forming porous film on a semiconductor substrate using a plasma CVD apparatus, comprising: a process of vaporizing an organic monomer and supplying the vapor into the reaction chamber; a process of forming fine organic particles through plasma reaction; a process of vaporizing a silicon compound having Si—O bond and supplying the vapor into the reaction chamber; a process of forming siloxane oligomer through plasma reaction; a process of supplying an organic amine into the reaction chamber and causing it to react with the siloxane oligomer; and a process of removing the fine organic particles from the thin film formed on the semiconductor substrate.

The present application claims priority to Japanese Patent Application No. 2005-342154, filed Nov. 28, 2005, the disclosure of which is incorporated herein by reference in its entirety.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method of forming a porous film on a semiconductor substrate, comprising the steps of:
    supplying a silicon compound containing at least one Si—O bond in its molecule in a gaseous phase into a reaction chamber;
    forming a siloxane oligomer through plasma reaction of the silicon compound; and
    suppplying an organic amine in a gaseous phase into the reaction chamber and reacting the organic amine with the siloxane oligomer, thereby forming a porous film on the semiconductor substrates,
    wherein the reaction chamber is divided into upper and lower sections, and the silicon compound is supplied into the upper section whereas the organic amine is supplied into the lower section.

2. The method according to claim 1, wherein the silicon compound has three or more Si—O bonds.

3. The method according to claim 1, wherein the silicon compound is a cyclic siloxane compound expressed by [Si(RR')—O]$_\alpha$ wherein R and R' are hydrocarbon groups, and $\alpha$ is an integer of 3 to 5.

4. The method according to claim 1, wherein the silicon compound is expressed by $SiR_5(OR_6)(OR_7)(OR_8)$ wherein $R_5$ is a hydrocarbon group of $C_{1-6}$, and $R_6$, $R_7$ and $R_8$ are independently $C_nH_{2n+1}$ wherein n is an integer of 1 to 3.

5. The method according to claim 1, wherein the silicon compound is expressed by $Si(OR_9)(OR_{10})(OR_{11})(OR_{12})$ wherein $R_9$, $R_{10}$, $R_{11}$ and $R_{12}$ are independently $C_nH_{2n+1}$ wherein n is an integer of 1 to 5.

6. The method according to claim 1, wherein the silicon compound is tetraethoxysilane or tetramethoxysilane.

7. The method according to claim 1, wherein the step of forming the siloxane oligomer further comprises supplying into the reaction chamber $H_2O$ or a compound having an OH bond in a gaseous phase as an additive gas.

8. The method according to claim 1, wherein the organic amine is expressed by the general formula $[R_{13}R_{14}R_{15}R_{16}N]^+ \cdot OH^-$, where $R_{13}$, $R_{14}$, $R_{15}$ and $R_{16}$ are $C_nH_{2n+1}$, n is an integer of 1 or greater.

9. The method according to claim 1, further comprising heating the semiconductor substrate after the film is formed thereon.

10. The method according to claim 1, wherein the silicon compound is supplied into the upper section through an upper shower plate to which RF power is applied, whereas the organic amine is supplied into the lower section through an intermediate shower plate.

11. The method according to claim 1, wherein the porous film has a dielectric constant of 2.7 or less.

12. The method according to claim 1, further comprising:
    supplying an organic monomer in a gaseous phase into the reaction chamber and forming fine organic particles through plasma reaction of the organic monomer, thereby forming the porous film including the fine organic particles; and
    removing the fine organic particles from the porous film formed on the substrate.

13. The method according to claim 12, wherein the removing of the fine organic particles is performed by heating.

14. The method according to claim 12, wherein the porous film has a dielectric constant of 2.5 or less.

15. A method of forming a porous film on a semiconductor substrate, comprising:
    supplying a silicon compound containing at least one Si—O bond in its molecule in a gaseous phase into a reaction chamber;
    forming a siloxane oligomer through plasma reaction of the silicon compound; and
    supplying an organic amine in a gaseous phase into the reaction chamber and reacting the organic amine with the siloxane oligomer to form a porous film on the semiconductor substrate;
    supplying an organic monomer in a gaseous phase into the reaction chamber and forming fine organic particles through plasma reaction of the organic monomer, thereby forming the porous film including the fine organic particles; and
    removing the fine organic particles from the porous film formed on the substrate,
    wherein the reaction chamber is divided into upper and lower sections, and the organic monomer is supplied into the upper section whereas the silicon compound and the organic amine are supplied into the lower section.

16. The method according to claim 15, wherein the organic monomer is supplied into the upper section through an upper shower plate to which RF power is applied, whereas the silicon compound and the organic amine are supplied into the lower section through an intermediate shower plate while RF power is applied to a susceptor on which the substrate is placed.

17. A method of forming a porous film on a semiconductor substrate, comprising:
    vaporizing an organic monomer and supplying the vapor into an upper section of a the reaction chamber;
    forming fine organic particles through plasma reaction of the organic monomer;
    vaporizing a silicon compound having at least one Si—O bond and supplying the vapor into a lower section of the reaction chamber where the semiconductor substrate is placed;
    forming a siloxane oligomer through plasma reaction of the vaporized silicon compound in the lower section of the reaction chamber;
    supplying an organic amine into the lower section of the reaction chamber and reacting the organic amine with the siloxane oligomer, thereby forming a thin film including the fine organic particles on the semiconductor substrate; and
    removing the fine organic particles from the thin film to form a porous film on the semiconductor substrate.

* * * * *

UNITED STATES PATENT AND TRADEMARK OFFICE
CERTIFICATE OF CORRECTION

| | | |
|---|---|---|
| PATENT NO. | : 7,585,789 B2 | Page 1 of 1 |
| APPLICATION NO. | : 11/604598 | |
| DATED | : September 8, 2009 | |
| INVENTOR(S) | : Yasuyoshi Hyodo et al. | |

It is certified that error appears in the above-identified patent and that said Letters Patent is hereby corrected as shown below:

At column 3, line 15, delete "processing" and insert -- process --, therefor.

At column 4, line 27, delete "interger" and insert -- integer --, therefor.

At column 5, line 36, delete "FIGURE" and insert -- figure --, therefor.

At column 6, line 36, delete "interger" and insert -- integer --, therefor.

At column 6, line 50, delete "intergers" and insert -- integers --, therefor.

At column 7, line 14, delete "interger" and insert -- integers --, therefor.

At column 11, line 23, in Claim 1, delete "supplying" and insert -- supplying --, therefor.

At column 11, line 26, in Claim 1, delete "substrates," and insert -- substrate, --, therefor.

At column 12, line 46, in Claim 18, delete "a the" and insert -- a --, therefor.

Signed and Sealed this

Sixteenth Day of February, 2010

David J. Kappos
*Director of the United States Patent and Trademark Office*